(12) United States Patent
Chittipeddi et al.

(10) Patent No.: US 6,365,327 B1
(45) Date of Patent: Apr. 2, 2002

(54) PROCESS FOR MANUFACTURING IN INTEGRATED CIRCUIT INCLUDING A DUAL-DAMASCENE STRUCTURE AND AN INTEGRATED CIRCUIT

(75) Inventors: Sailesh Chittipeddi, Allentown, PA (US); Sailesh Mansinh Merchant, Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/386,065

(22) Filed: Aug. 30, 1999

(51) Int. Cl.$^7$ .............................. G03F 7/36; G03C 5/58; H01L 21/31; H01L 21/311; H01L 21/308; H01L 21/4763

(52) U.S. Cl. ...................... 430/313; 430/314; 430/316; 430/317; 430/312; 430/319; 430/5; 438/700; 438/702; 438/761; 438/778; 438/780; 438/787; 438/785; 438/791; 438/618

(58) Field of Search .................................. 430/313, 317, 430/319, 312, 314, 316, 5; 438/761, 778, 700, 702, 780, 787, 785, 791, 618

(56) References Cited

U.S. PATENT DOCUMENTS

| 5,635,423 A | * | 6/1997 | Huang et al. ................ 437/195 |
| 5,877,076 A | * | 3/1999 | Dai ............................ 438/597 |
| 6,042,999 A | * | 3/2000 | Lin et al. .................... 430/316 |

FOREIGN PATENT DOCUMENTS

| EP | 0 834 916 A2 | 4/1998 | ......... H01L/21/768 |
| WO | WO 99/33102 | 7/1999 | ......... H01L/21/768 |
| WO | WO 00/03432 | 1/2000 | ......... H01L/21/768 |
| WO | WO 00/05763 | 2/2000 | ......... H01L/21/768 |
| WO | WO 00/10202 | 2/2000 | ......... H01L/21/485 |

OTHER PUBLICATIONS

European Standard Search Report—Dated: Apr. 2, 2001.

* cited by examiner

Primary Examiner—Janet Baxter
Assistant Examiner—Sin J. Lee

(57) ABSTRACT

A process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers.

20 Claims, 3 Drawing Sheets

US 6,365,327 B1

PROCESS FOR MANUFACTURING IN INTEGRATED CIRCUIT INCLUDING A DUAL-DAMASCENE STRUCTURE AND AN INTEGRATED CIRCUIT

CROSS REFERENCED APPLICATIONS

The present invention is related to patent application Ser. No. 09/385,165, entitled A PROCESS FOR MANUFACTURING AN INTEGRATED CIRCUIT INCLUDING A DUAL-DAMASCENE STRUCTURE AND AN INTEGRATED CIRCUIT filed on Aug. 30, 1999.

FIELD OF THE INVENTION

The present invention relates generally to integrated circuits and, more particularly, to a process for forming dual damascene structures in an integrated circuit.

BACKGROUND OF THE INVENTION

Single damascene is an interconnection fabrication process for integrated circuits in which grooves are formed in an insulating layer and filled with a conductive material to form interconnects. Dual damascene is a multi-level interconnection process in which, in addition to forming the grooves of single damascene, conductive contact (or via) openings are also formed in the insulating layer. A conductive material is formed in the grooves and conductive contact (or via) openings.

In one standard dual damascene process, a first oxide layer is deposited over a conductive structure. A hard mask is formed over the first oxide layer and a first patterned photoresist layer is formed on the hard mask. The hard mask is patterned using the first photoresist layer as a pattern. The first photoresist layer is removed and a second oxide layer is then formed over the hard mask.

A second patterned photoresist layer is formed over the second oxide layer. Both the first oxide layer and the second oxide layer are etched to form the dual damascene opening. The first oxide layer is etched using the hard mask as a pattern and the underlying conductive structure as an etch stop. The second oxide layer is etched using the second photoresist layer as a pattern and the hard mask as an etch stop. The second photoresist layer is then stripped.

This process involves a combination of different steps to form the dual damascene structure. For example, the hardmask is patterned prior to forming the second dielectric layer. Thus, the partially fabricated integrated circuit is transferred between different processing systems to perform the different deposition and patterning steps.

In another dual damascene process, a dielectric is formed and patterned using a first photoresist. The first photoresist is removed and the dielectric is patterned again using a second photoresist. The vias and grooves are formed using the different patterning steps. This process uses a timed etch to control the depth of the grooves. This process is difficult to control. Thus, it is desirable to develop a process that reduces the complexity of the process to form a dual damascene structure.

SUMMARY OF THE INVENTION

The present invention is directed to a process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers. In one embodiment, the via or contact openings are formed prior to the grooves.

By using the two mask layers after the stack is formed, the number of processing steps and movement of the partially fabricated integrated circuit between systems may be reduced. In other words, the insulating layers and the etch stop may be formed and then subsequently patterned to form the dual damascene structure. Further, the insulating layer and the etch stop layer may be formed in the same chamber or cluster of chambers.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The illustrative embodiment of the present invention is directed to a process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers. In one alternative embodiment, the via or contact openings are formed prior to formation of the grooves.

By using the two mask layers after the stack is formed, the number of processing steps and movement of the partially fabricated integrated circuit between systems may be reduced. In other words, the insulating layers and the etch stop may be formed and then subsequently patterned to form the dual damascene structure. Further, the insulating layer and the etch stop layer may be formed in the same chamber or cluster of chambers.

Figure 1:
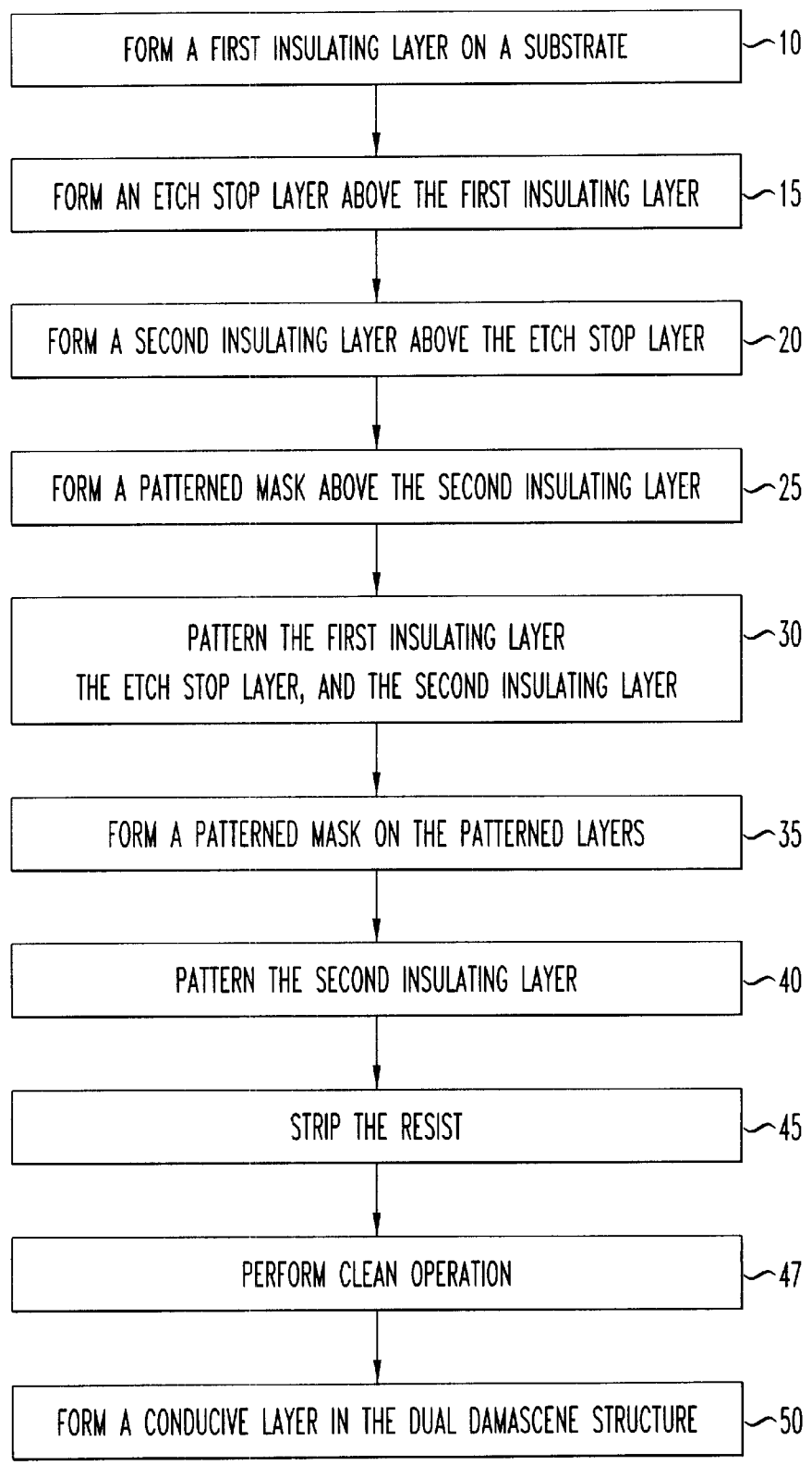
FIG. 1 is a flowchart diagram illustrating the process for manufacturing an integrated circuit according to an illustrative embodiment of the present invention.
Figure 2:
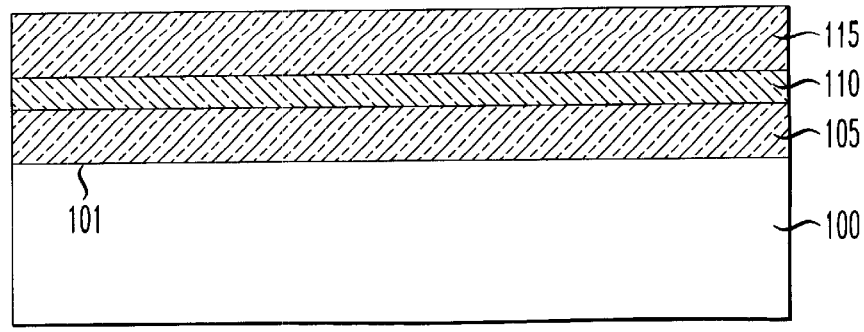
FIGS. 2–7 are schematic diagrams of an integrated circuit during successive stages of manufacture using the process of FIG. 1.
Figure 3:
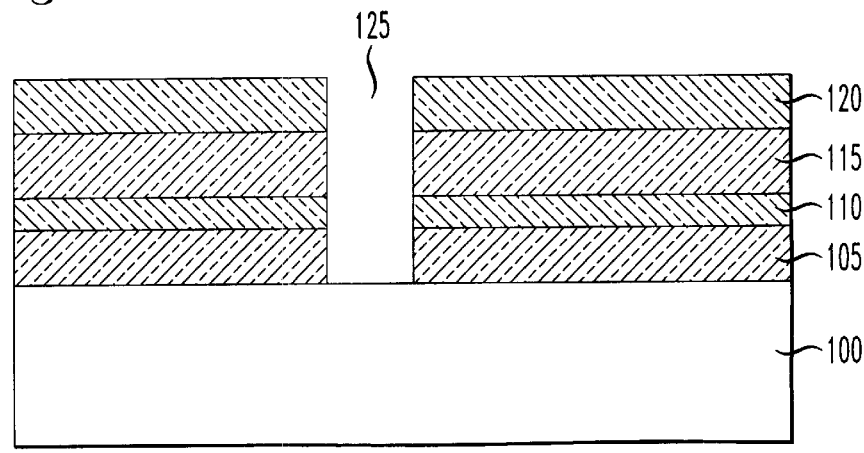
Figure 4:
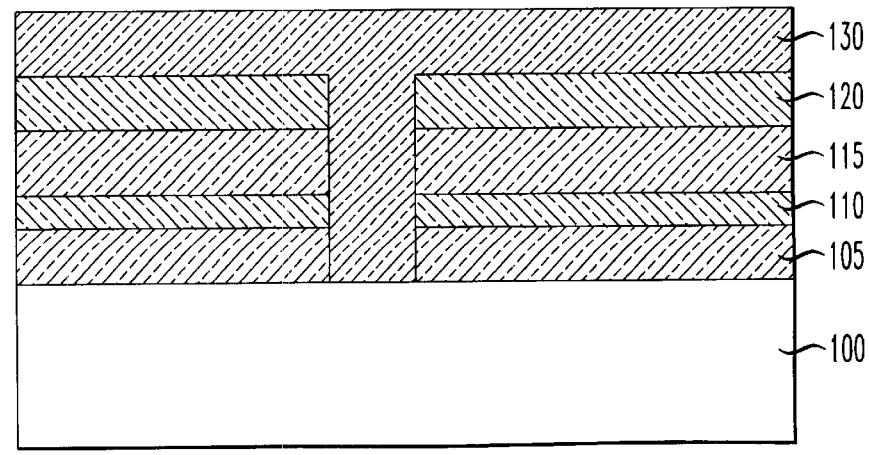
Figure 5:
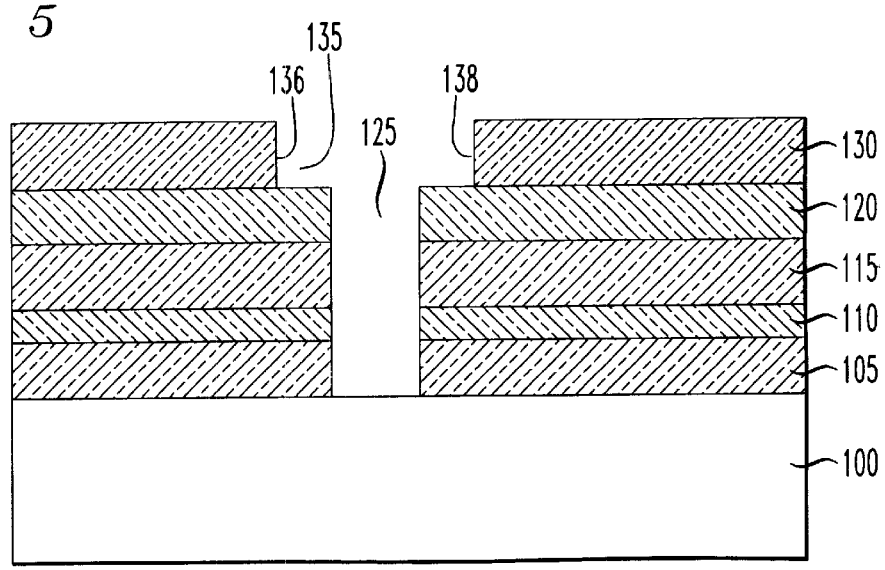
Figure 6:
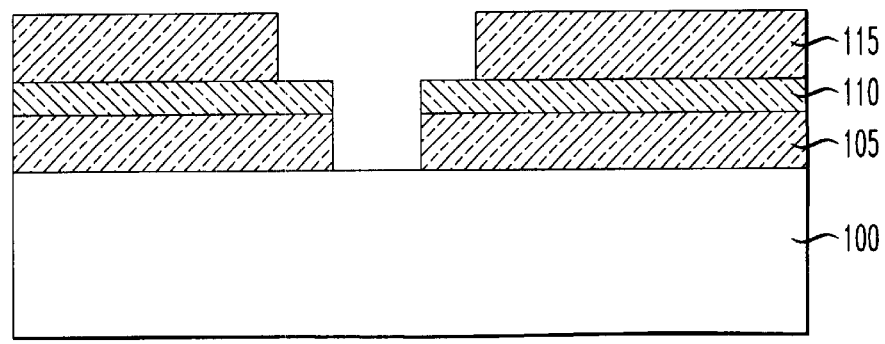

Referring now to the drawing, wherein like reference numerals refer to like elements throughout, FIG. 1 is a flow chart diagram illustrating an exemplary embodiment of the present invention. FIGS. 2–7 are schematic diagrams illustrating the successive stages of manufacture of an integrated circuit according to the flow chart shown in FIG. 1.

At step 10, a first insulating layer 105 is formed on a substrate 100. The first insulating layer 105 is, for example, a dielectric such as a high-density deposited silicon oxide (e.g., $SiO_2$). Alternatively, the first insulating layer may be a borophosphosilicate glass, a phosphosilicate glass, a glass formed from phosphorous and/or boron-doped tetraethyl orthosilicate, spin-on glass, xerogels, aerogels, or other low dielectric constant films such as polymer, fluorinated oxide and hydrogen silsesquioxane.

The substrate 100 is, for example, a semiconductor such as silicon or compound semiconductor such as GaAs or SiGe. Alternatively, the substrate 100 may be an intermediate layer in an integrated circuit such as a dielectric, conductor, or other material. In addition, the upper surface 101 of the substrate 100 may not be planar. In this case, the first insulating layer 105 may be planarized using, for example, chemical mechanical polishing (CMP) as is well known.

At step 15, an etch stop layer 110 is formed above or in direct contact with the first insulating layer 105. In an alternative embodiment, one or more layers may be formed between the etch stop layer 110 and the first insulating layer 105. The material for the etch stop layer may be selected to be more etch resistant than the second insulating layer 115 for a selected etchant. In other words, the etch stop layer 110 etches at a slower rate than the second insulating layer 105 when exposed to a selected etchant. For example, the etch stop layer may be TiN where the second insulating is $SiO_2$. Further, the etch stop layer may be Ta/TaN, $Si_3N_4$, a silicon-rich oxide, or a multi-layered $SiO_2$ dielectric.

At step 20, a second insulating layer 115 is formed above or in direct contact with the etch stop layer 115. The second layer 115 may be formed using the same materials and processes used to form the first insulating layer 105. At step 25, a first patterned mask 120 is formed above or on the insulating layer 115. The first patterned mask 120 includes openings that correspond to the via or contact openings 125 (hereinafter referred to as "openings") to provide interconnections between different levels in the integrated circuit.

At step 30, openings are opened in the first insulating layer 105, the etch stop layer 110, and the second insulating layer 115. The openings may be opened using conventional etching techniques or a combination of techniques to etch through at least the three different layers. Alternatively, step 30 may etch only the second insulating 115. In this case, at step 40, the exposed portion of the etch stop layer 110 and the corresponding portion of the first insulating 105 below the exposed portion would be etched to complete the via when the groove is etched.

Illustratively, the openings are formed by: 1) applying a layer of resist material (the first patterned mask) on the second insulating layer 115; 2) exposing the resist material to an energy source which passes, through a reticle; 3) removing areas of resist to form the pattern in the resist; and 4) etching the openings 125. The energy source may be an e-beam, light source, or other suitable energy source.

Subsequently, at step 35, a second patterned mask 130 is formed above or on the first patterned mask 120. Illustratively, the second patterned mask 130 is formed prior to completely removing the first mask layer 120 and after etching at least one of the plurality of layers 105, 110, 115 by: 1) applying a layer of resist material in the openings 125 and on the first patterned mask 120; 2) exposing the resist material to an energy source which passes through a reticle; and 3) removing areas of resist to form the pattern in the resist. The energy source may be an e-beam, light source, or other suitable energy source.

At step 40, the second insulating layer 115 is patterned to form grooves 135 corresponding to the conductive runners to be formed. The second insulating layer 115 may be patterned using conventional etching techniques. During etching, the etch stop layer 110 is used to define the endpoint for this etching process. The openings are contained or at least partially contained within the borders 136, 138 of the grooves 135. Then, at step 45, the remaining portions of the mask layers 120, 130 are stripped using well-known techniques and the partially completed integrated circuit is cleaned at step 47 using conventional processes.

At step 50, a conductive layer 145 is blanket deposited above the second insulating layer 115 and in the openings and grooves. Then, the portions of the conductive layer outside the grooves 135 and on or above the second insulating layer are removed to complete the interconnect. This may be accomplished using a conventional chemical mechanical polishing process. The conductive layer 145 is a conducting material such as tungsten, aluminum, copper, nickel, polysilicon, or other conducting material suitable for use as a conductor as is known to those skilled in this art.

Figure 7:
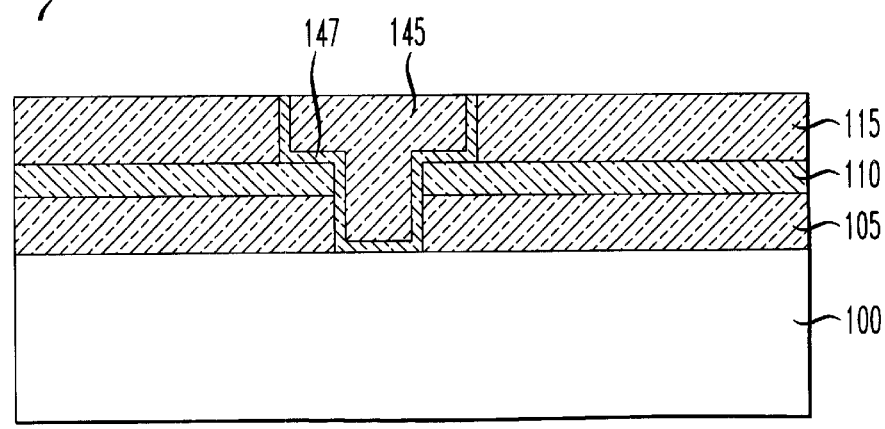

In an alternative embodiment, one of more layers, may be formed prior to the deposition of the conductive layer 145. These layers may be barrier layers preventing the migration of moisture and contaminants between the conductive layer and the surrounding layers. An exemplary barrier layer 147 is shown in FIG. 7. For example, if the conductive layer 145 is copper, a barrier layer 147 including layers Ta and TaN may be deposited on the second insulating layer 120 and in the openings and grooves prior to the deposition of the conductive layer. Where the conductive layer 145 includes Al, a barrier layer 147 including layers of (1) Ti and TiN or (2) Ti and TiN and Ti may be used.

In addition, a capping layer, such as $Si_3N_4$, TaN, TiN, or TiW may be formed on the upper surface of the conductive layer. Other materials for the barrier layer include WSi, TiW, Ta, TaN, Ti, TiN, Cr, Cu, Au, WN, TaSiN, or WSiN. The barrier layer 147 may also function as an adhesion layer and/or a nucleation layer for the subsequently formed conductive layer.

Subsequently, the integrated circuit is completed by adding, if necessary, additional metal levels that may including interconnects formed using the process above and conventional processes to complete an integrated circuit. The integrated circuit also includes transistors and other components necessary for a particular integrated circuit design. The processes for manufacturing an integrated circuit including these structures are described in 1–3 Wolf, *Silicon Processing for the VLSI Era*, (1986), which is incorporated herein by reference.

The present invention relates to a method for manufacturing an integrated circuit comprising: (a) forming a first opening in a stack of layers having a first layer, a second layer, and a stop layer; and (b) forming a second opening having a base in at least one of the layers, the second opening larger than the first opening and the first opening formed at least in a portion of the base. In an advantageous embodiment, the first and second layers are dielectrics. In such an embodiment, the dielectric may be selected from the group consisting of Ta, TaN, $Si_3N_4$, a silicon-rich oxide, and a multi-layered $SiO_2$ dielectric. A conductive material may be formed in the first opening and the second opening to form interconnects in the integrated circuit. The conductive material may be selected from the group consisting of Cu, Al, W, Ni, polysilicon, and Au.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed:

1. A method for manufacturing an integrated circuit comprising:
   (a) forming, using a first mask layer, a first opening in a stack of layers having a first layer, a second layer, and a stop layer; and (b) forming, using the second mask layer and prior to completely removing the first mask layer, a second opening having a base in at least one of the layers, the second opening larger than the first opening and the first opening formed at least in a portion of the base; wherein step (a) is performed prior to forming a second mask layer.

2. The method of claim 1 wherein step (a) is performed prior to step (b).

3. The method of claim 1 further comprising forming the stop layer between the first layer and the second layer to form the stack.

4. The method of claim 3 wherein step (a) further comprises forming the first opening in the stop layer, the first layer, and the second layer.

5. The method of claim 4 wherein step (b) further comprises forming the second opening in one of the first layer and the second layer.

6. An integrated circuit formed according to the process of claim 1.

7. The method of claim 1 wherein the stop layer is selected from the group consisting of Ta, TaN, $Si_3N_4$, a silicon-rich oxide, and a multi-layered $SiO_2$ dielectric.

8. The method of claim 1 wherein the first layer and the second layer are a dielectric.

9. The method according to claim 8 wherein the dielectric is selected from the group consisting of Ta, TaN, $Si_3N_4$, a silicon-rich oxide, and a multi-layered $SiO_2$ dielectric.

10. The method of claim 1 further comprising forming a conductive material in the first opening and the second opening to form interconnects in the integrated circuit.

11. The method of claim 10 wherein the conductive material is selected from the group consisting of Cu, Al, W, Ni, polysilicon, and Au.

12. A method for manufacturing an integrated circuit comprising:
   (a) forming, using a first mask layer and prior to using a second mask layer, a first opening in a stack of layers having a first layer, a second layer, and a stop layer wherein the stop layer is formed between the first layer and the second layer to form the stack of layers and wherein the first opening is formed in the stop layer, the first layer, and the second layer;
   (b) forming, using the second mask layer and prior to completely removing the first mask layer, a second opening having a base in at least one of the layers, the second opening larger than the first opening and the first opening formed at least in a portion of the base; and
   (c) exposing a surface of the stop layer to form the base.

13. A method for manufacturing an integrated circuit comprising:
   (a) forming a stop layer between a first layer and a second layer;
   (b) forming, using a first mask layer, a first opening in the stop layer and at least one of the first layer and the second layer; and
   (c) forming, using the second mask layer end prior to completely removing the first mask layer, a second opening having an outer boundary in one of the first layer and the second layer, the second opening larger than the first opening and the first opening formed at least partially within the outer boundary;
   wherein step (b) is performed prior to forming a second mask layer.

14. An integrated circuit manufactured according to the process recited in claim 13.

15. The method of claim 13 further comprising forming a conductive material in the first opening and the second opening to form interconnects in the integrated circuit.

16. A method of manufacturing an integrated circuit comprising:
   (a) forming a plurality of layers;
   (b) forming a first mask layer;
   (c) forming, prior to completely removing the first mask layer and after etching at least one of the plurality of layers, a second mask layer; and
   (d) forming a dual damascene structure using the first mask layer and the second mask layer.

17. The method of claim 16 further comprising forming a conductive material in the dual damascene structure to form interconnects in the integrated circuit.

18. A method of manufacturing an integrated circuit comprising:
   (a) forming a plurality of layers;
   (b) forming a first mask layer;
   (c) forming, prior to completely removing the first mask layer, a second mask layer;
   (d) forming a dual damascene structure using the first mask layer and the second mask layer; and
   (e) etching, prior to step (c), two layers of the plurality of layers.

19. A method of manufacturing an integrated circuit comprising:
   forming a plurality of layers having an upper surface;
   forming, prior to etching the plurality of layers, a first mask layer having a first pattern above the upper surface;
   forming, after etching at least one of the plurality of layers, a second mask layer having a second pattern above the upper surface and above the first mask layer, the first pattern different from the second pattern; and
   forming a dual damascene structure using the first mask layer and the second mask layer.

20. A method for manufacturing an integrated circuit comprising:
   (a) forming a stop layer between a first layer and a second layer;
   (b) forming a first opening in the stop layer, the first layer and the second layer, where step (b) further comprises:
      forming a first pattern layer above the second layer; and
      etching the first layer, the stop layer, and the second layer; and
   (c) forming a second opening having an outer boundary in one of the first layer and the second layer, the second opening larger than the first opening and the first opening formed at least partially within the outer boundary, where step (c) further comprises:
      forming a second pattern layer above the first pattern layer, and
      etching the second layer; and
   wherein step (b) is performed prior to step (c).

* * * * *